United States Patent [19]

Wataguchi

[11] Patent Number: 5,010,383

[45] Date of Patent: Apr. 23, 1991

[54] POWER TRANSISTOR DEVICE AND METHOD FOR MAKING THE SAME

[75] Inventor: Masaharu Wataguchi, Ota, Japan

[73] Assignee: Sanyo Electric Co. Ltd., Osaka, Japan

[21] Appl. No.: 596,737

[22] Filed: Oct. 11, 1990

Related U.S. Application Data

[63] Continuation of Ser. No. 310,781, Feb. 14, 1989, abandoned.

[30] Foreign Application Priority Data

Feb. 18, 1988 [JP] Japan .................. 63-35662

[51] Int. Cl.⁵ .............................. H01L 29/72
[52] U.S. Cl. ....................... 357/36; 357/51; 357/55; 357/68
[58] Field of Search .............. 357/36, 51, 55, 68

[56] References Cited

U.S. PATENT DOCUMENTS 4,223,335  9/1980  Kane ............................ 357/36
4,656,491  4/1987  Igarashi ........................ 357/36

FOREIGN PATENT DOCUMENTS

56-13383  3/1981  Japan .

Primary Examiner—Edward J. Wojciechowicz
Attorney, Agent, or Firm—Darby & Darby

[57] ABSTRACT

A power transistor device includes a substrate arrangement defined by a collector region, a base region provided within the collector region, an elongated resistor region provided within the base region and located at about center thereof, and first and second emitter regions provided within the base region located equidistantly and on opposite sides of the resistor region. A first electrode segment is provided having one end thereof connected to the first emitter region and other end thereof connected to one end portion of the resistor region, a second electrode segment having one end thereof connected to the second emitter region and other end thereof connected to other end portion of the resistor region, and a median electrode segment provided at middle of the resistor region for providing the same amount of predetermined resistances between the first electrode and the median electrode and between the second electrode and the median electrode, the median electrode being used for an output of the first and second emitter regions through the predetermined resistances, respectively.

9 Claims, 7 Drawing Sheets

POWER TRANSISTOR DEVICE AND METHOD FOR MAKING THE SAME

This is a continuation of application Ser. No. 310,781, filed Feb. 14, 1989 now abandoned.

BACKGROUND OF THE INVENTION

1. Field of the Invention

The present invention relates to a power transistor device which has a high secondary breakdown strength, and also to a substrate arrangement for such as power transistor device, and a method for making the same.

2. Description of the Prior Art

When a transistor is used with its emitter grounded, a secondary breakdown will take place if a reverse direction voltage between the collector and emitter increases. The secondary breakdown is mainly due to the thermal unstableness in the lateral direction which causes electric current concentration locally in the unstable area, resulting in the breakage of the transistor. One method to increase the stable operating range (ASO) of the power transistor is to divide the emitter portion into a number of sections to equally divide the emitter current, and connect an emitter stabilizing resistor to each divided emitter section. If the emitter current through a particular section should abnormally increase, the voltage drop across the emitter stabilizing resistor produces a negative feed back current, thereby preventing the local concentration of the emitter current. Such a method and arrangement is disclosed, for example, in Japanese Patent Publication No. 56-13383 issued Mar. 27, 1981.

Figure 8:
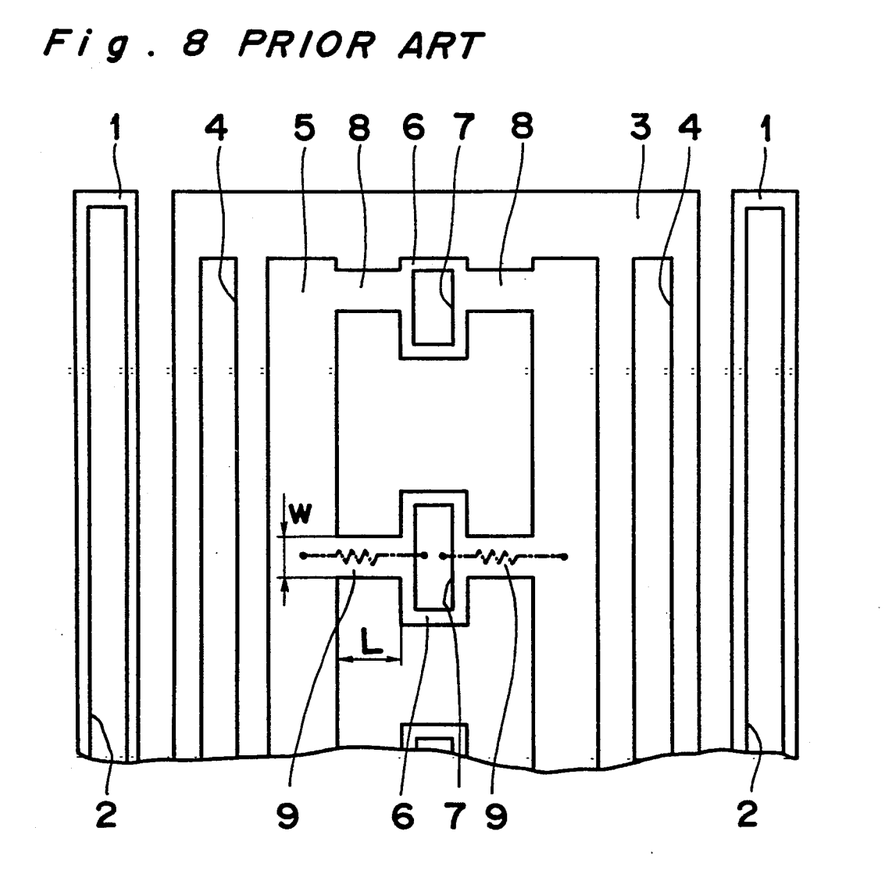
FIG. 8 is a diagrammatic view showing an arrangement of the transistor unit in the power transistor device according to the prior art.

A typical example of a prior art power transistor is shown in FIG. 8 in which reference number 1 is an N+ type collector region, 2 is an opening for connecting the collector region 2, 3 is a P type base region, 4 is an opening for connecting the base, 5 is an N+ type emitter region, 6 is an emitter connecting region, 7 is an opening for connecting the emitter, 8 is a resistor region for providing the emitter stabilizing resistor 9 which usually has about 1 to several ohms.

However, according to the arrangement shown in FIG. 8, a distance between two neighboring emitter contact regions 6 is rather long, and thus there will be produced non-contributing area on the surface of the base region 3. Thus, when the arrangement shown in FIG. 8 is employed, it is difficult to reduce the size thereof.

Furthermore, if the resistance of the emitter stabilizing resistor is made large, the secondary breakdown can be avoided, but such a transistor will result in a low efficiency, i.e., narrowing the dynamic range of the transistor. On the other hand, if the resistance of the emitter stabilizing resistor is made small, the operating range of the negative feedback effected by the negative temperature coefficient characteristics of the resistor region 8 will be narrowed.

In light of the above, in order to optimize the arrangement of the power transistor device, the resistance of the emitter stabilizing resistors should be made as small as possible, and as uniform as possible.

Figure 4A:
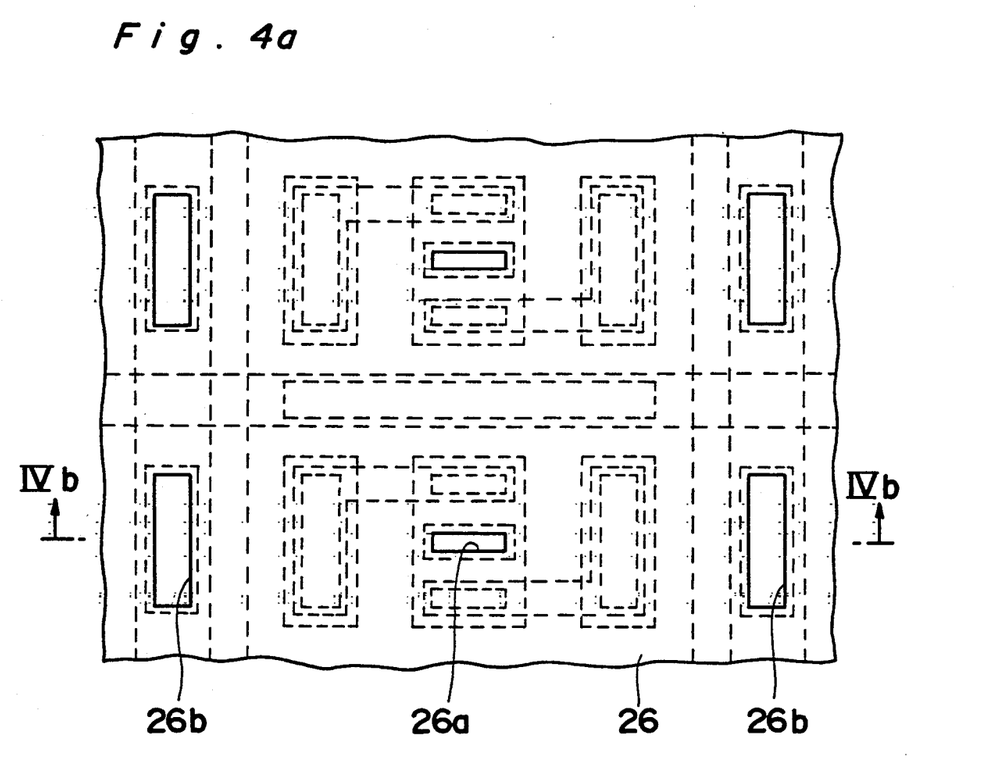
FIG. 4a is a fragmentary top plan view of a semiconductor substrate S further provided with a second insulation layer on the first electrode layer.
Figure 4B:
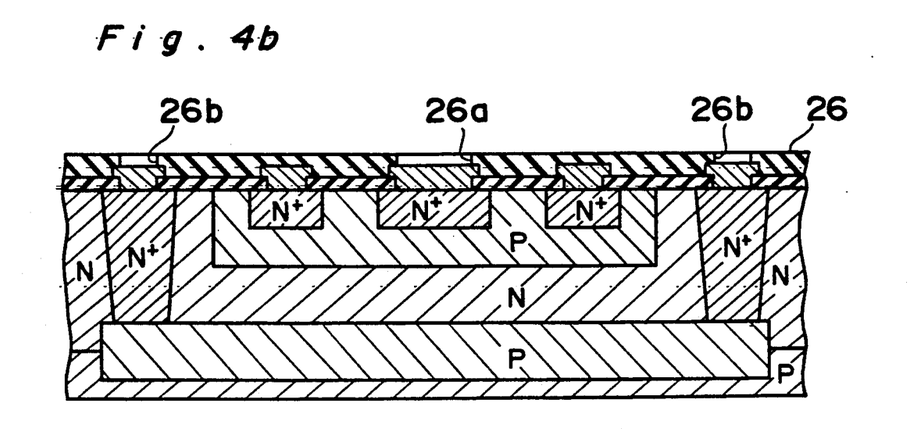

However, according to the prior art arrangement shown in FIG. 4, since the resistor region 8, emitter region 5 and the emitter contact region 6 are provided in the same diffusion layer, the change of the width W of the resistor region 8 will eventually change the length L thereof. Thus, the emitter stabilizing resistor 9 varies greatly, thus making it difficult to reduce the resistance of such a resistor.

SUMMARY OF THE INVENTION

The present invention has been developed with a view to substantially solving the above described disadvantages and has for its essential object to provide an improved power transistor device which is compact in size, and stable in operation.

It is also an important object of the present invention to provide a power transistor device which has a high efficiency and high secondary breakdown strength.

It is another object of the present invention to provide a power transistor device which enables an optimize arrangement.

In accomplishing these and other objects, a substrate arrangement for a power transistor device according to the present invention comprises a collector region having an upper surface, a base region provided within the collector region with an upper surface thereof in flush with the upper surface of the collector region, an elongated resistor region provided within the base region and located at about center thereof with an upper surface thereof in flush with the upper surface of the base region, and first and second emitter regions provided within the base region located equidistantly and on opposite sides of the resistor region with upper surfaces thereof in flush with the upper surface of the base region.

A power transistor device according to the present invention comprises, in addition to the above described substrate arrangement, a first electrode segment having one end thereof connected to the first emitter region and other end thereof connected to one end portion of the resistor region, a second electrode segment having one end thereof connected to the second emitter region and other end thereof connected to other end portion of the resistor region, and a median electrode segment provided at middle of the resistor region for providing the same amount of predetermined resistances between the first electrode and the median electrode and between the second electrode and the median electrode, the median electrode being used for an output of the first and second emitter regions through the predetermined resistances, respectively.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIG. 1b is a cross sectional view taken along a line Ib—Ib shown in FIG. 1a;

FIG. 2b is a cross sectional view taken along a line IIb—IIb shown in FIG. 2a;

FIG. 3b is a cross sectional view taken along a line IIIb—IIIb shown in FIG. 3a;

FIG. 4b is a cross sectional view taken along a line IVb—IVb shown in FIG. 4a;

FIG. 5b is a cross sectional view taken along a line Vb—Vb shown in FIG. 5a;

DETAILED DESCRIPTION OF THE PREFERRED EMBODIMENT

A high power transistor device according to a preferred embodiment of the present invention is basically formed by a semiconductor substrate S (FIGS. 1a and 1b), first electrode layer 20 defined by electrode segments 21, 22 and 23 and a section 24 (FIGS. 3a and 3b) provided over the substrate S, and second electrode layer 30 defined by sections 31 and 32 (FIGS. 5a and 5b) provided over the first electrode layer. Provided between the substrate S and the first electrode layer is a first insulation layer 19 having a plurality of contact openings 19a–19d, as shown in FIGS. 2a and 2b. Also, provided between the first and second electrode layers is a second insulation layer 26 having a plurality of contact openings 26a and 26b, as shown in FIGS. 4a and 4b. Each of these will be described in detail below.

Figure 1A:
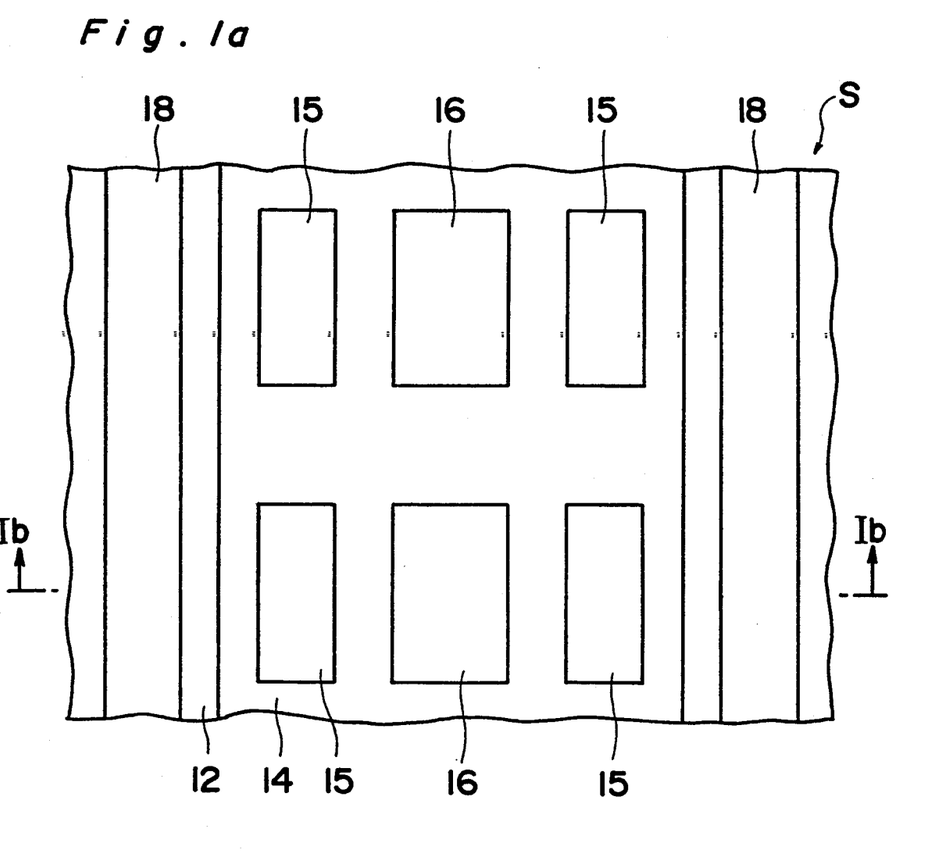
FIG. 1a is a fragmentary top plan view of a semiconductor substrate S on which electrodes are provided.
Figure 1B:
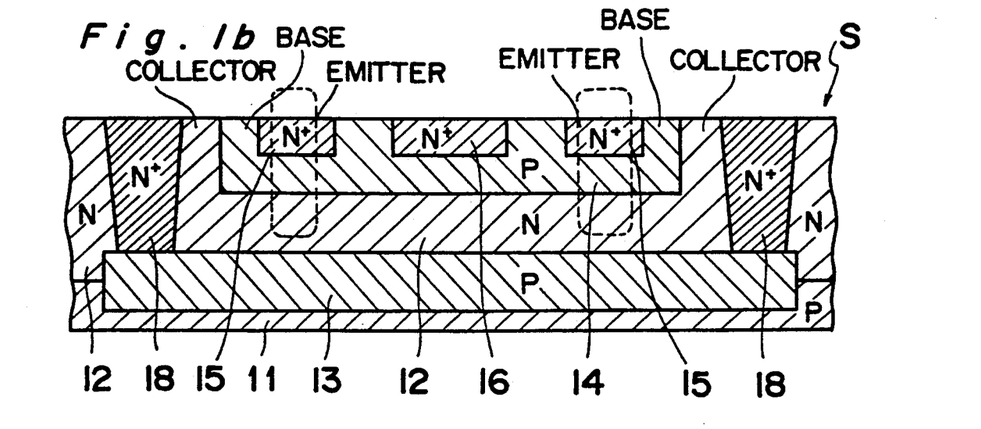
Figure 2A:
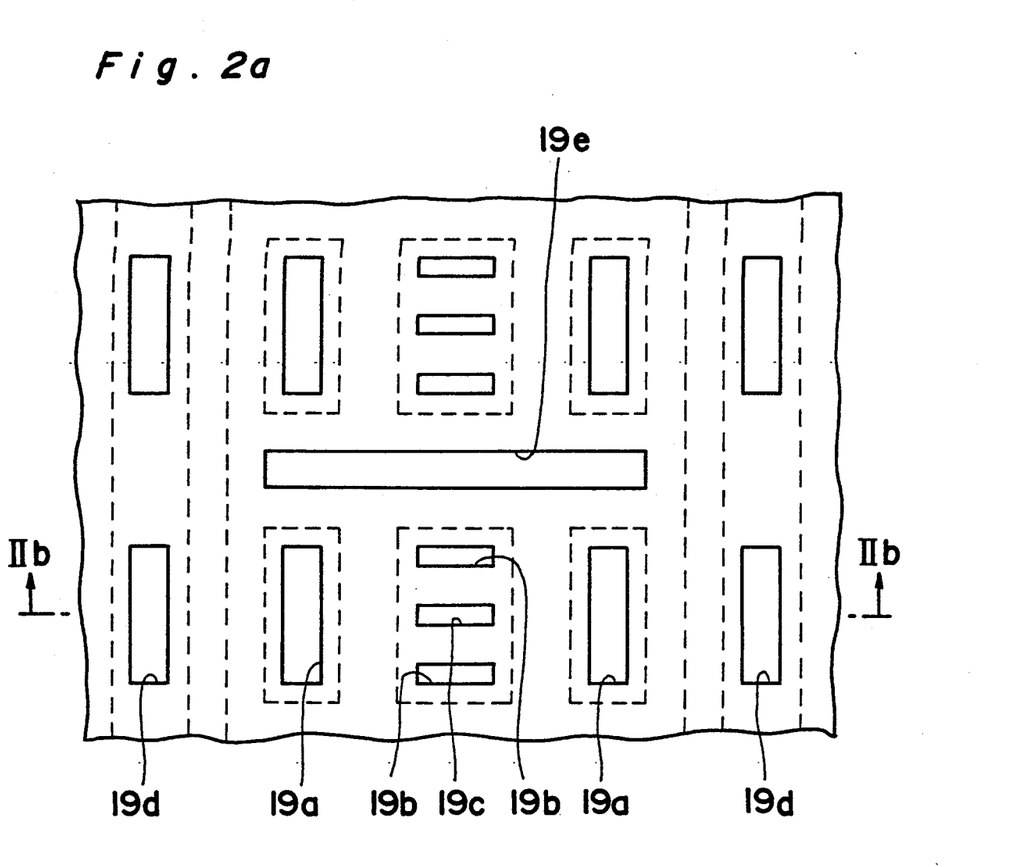
FIG. 2a is a fragmentary top plan view of a semiconductor substrate S provided with a first insulation layer.
Figure 2B:
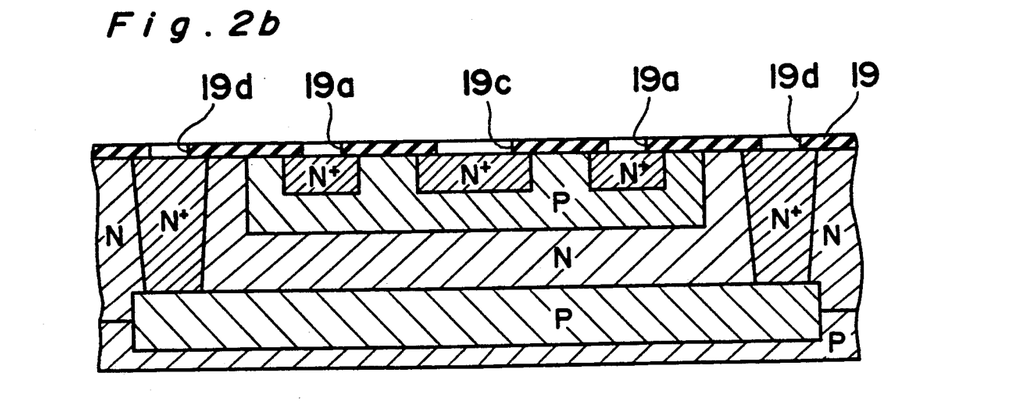

Referring to FIGS. 1a and 1b, a semiconductor substrate S is shown. In the drawings, reference number 11 is a P type semiconductor base, 12 is an N type epitaxial layer provided over the base 11 for forming a collector of a transistor, thus it is called a collector layer, 13 is an N+ type layer formed in the base 11, 14 is a P type region provided on the epitaxial layer 12 for forming a base of a transistor, thus it is called a base region, 15 is an N+ type region provided on the P type region 14 for forming an emitter of a transistor, thus it is called an emitter region, 16 is an N+ type region provided on the P type region 14, formed simultaneously with the region 15, for forming an emitter stabilizing resistor which is to be connected to the emitter, thus it is called a resistor region, and 18 is an N+ type region provided on the layer 13 for forming a low resistance conductor for connecting the collector layer 12. The pattern shown in FIG. 1a is repeated in two orthogonal directions, as shown in FIG. 6 in which a rectangular area enclosed by a line A corresponds to the area shown in FIGS. 1a–5b. The emitter region 14 is provided by a number of columns aligned parallel to each other.

By the above described substrate arrangement, NPN transistor units are formed, for example, at regions enclosed by dotted line circles shown in FIG. 1b. Instead of NPN, it is possible to arrange a PNP transistor units by merely changing the type of semiconductor materials in various regions.

Referring to FIGS. 2a and 2b, a first insulation layer 19, such as an oxide layer, is provided on the semiconductor substrate S with a plurality of openings 19a, 19b, 19c, 19d and 19e formed therein. Opening 19a is formed over each emitter region 15, openings 19b are formed at opposite end portions of each resistor region 16, opening 19c is formed at the middle of each resistor region 16, opening 19d is formed over region 18 adjacent each region 15, and opening 19e is formed over base region 14 at area between resistor regions 16.

Figure 3A:
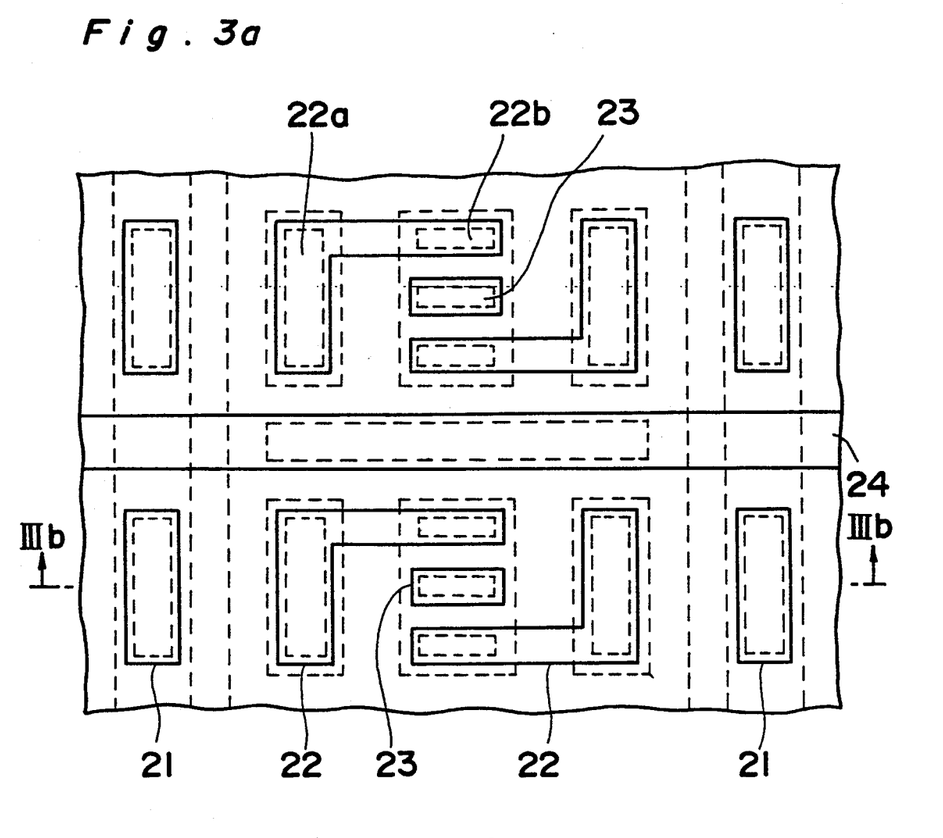
FIG. 3a is a fragmentary top plan view of a semiconductor substrate S further provided with a first electrode layer on the first insulation layer.
Figure 3B:
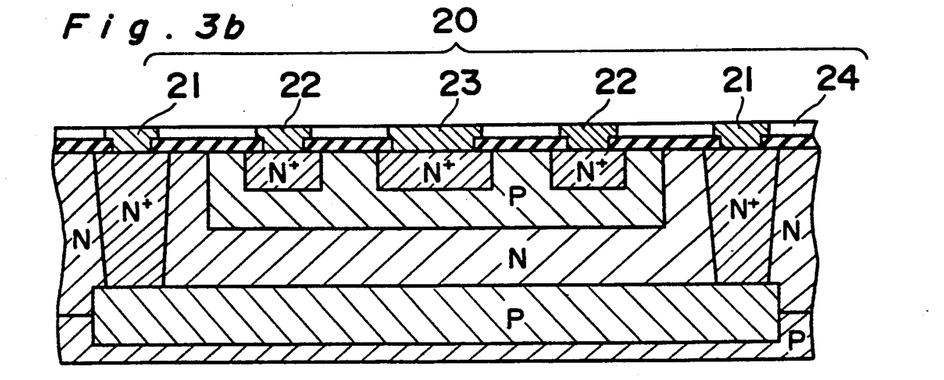

Referring to FIGS. 3a and 3b, first electrode layer 20 defined by electrode segments 21, 22 and 23 and an elongated electrode section 24 are provided over the insulation layer 19. Specifically, each electrode segment 21 is provided over opening 19d so that it is connected with the region 18. Each electrode segment 22 has an L shape configuration having one arm 22a provided over opening 19a so as to be connected with emitter region 15, and another arm 22b provided over opening 19b so as to be connected with one end portion of resistor region 16. Electrode segment 23 is provided over opening 19c so as to be connected with the middle portion of resistor region 16, thus it is called a median electrode segment 23. Finally, elongated electrode section 24 laterally extends over openings 19e to connect base regions 14 of the transistor units aligned laterally. As best shown in FIG. 6, laterally extending electrode sections are aligned in parallel and are connected at one end, so that electrode sections eventually defines a comb shaped configuration, thereby connecting all the base regions 14.

By the resistivity of resistor region 16, a predetermined resistance will be produced between arm 22b and median electrode segment 23 so as to provide the emitter stabilizing resistor. Accordingly, emitter region 15 is connected through L shaped electrode segment 22 to the resistor region 16 defining a predetermined resistance and further to median electrode segment 23.

Referring to FIGS. 4a and 4b, second insulation layer 26 is provided over the first electrode layer 20. The second insulation layer 26 has a plurality of openings 26a and 26b. Each opening 26a is formed over median electrode segment 23 and each opening 26b is formed over electrode segment 21.

Figure 5A:
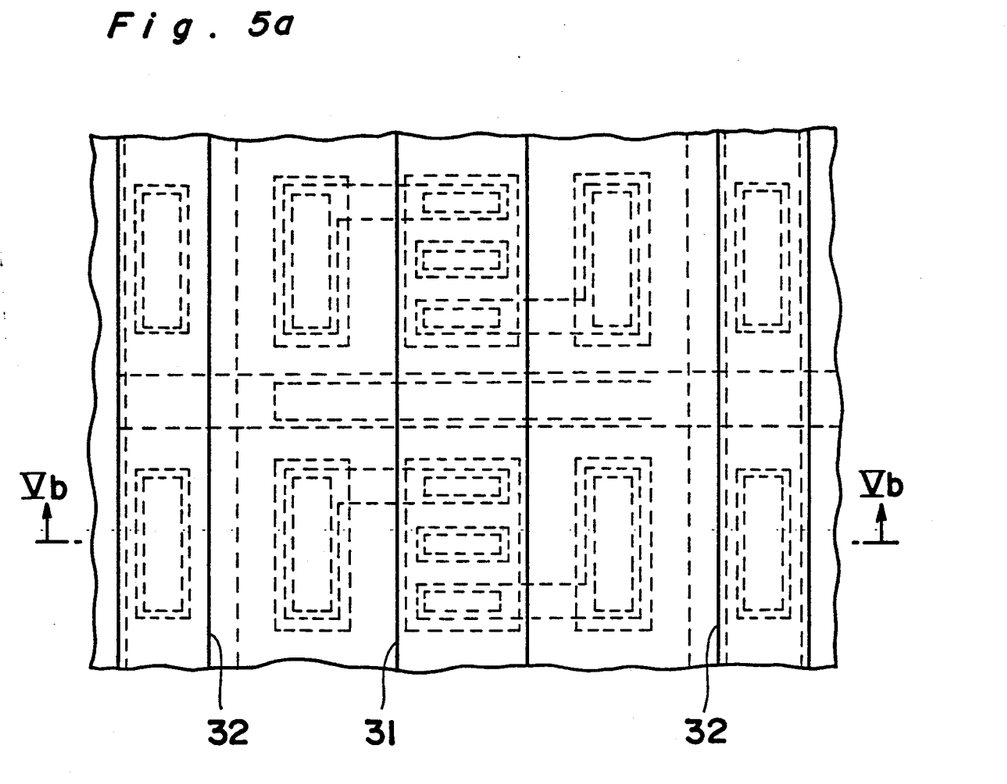
FIG. 5a is a fragmentary top plan view of a semiconductor substrate S further provided with a second electrode layer on the second insulation layer.
Figure 5B:
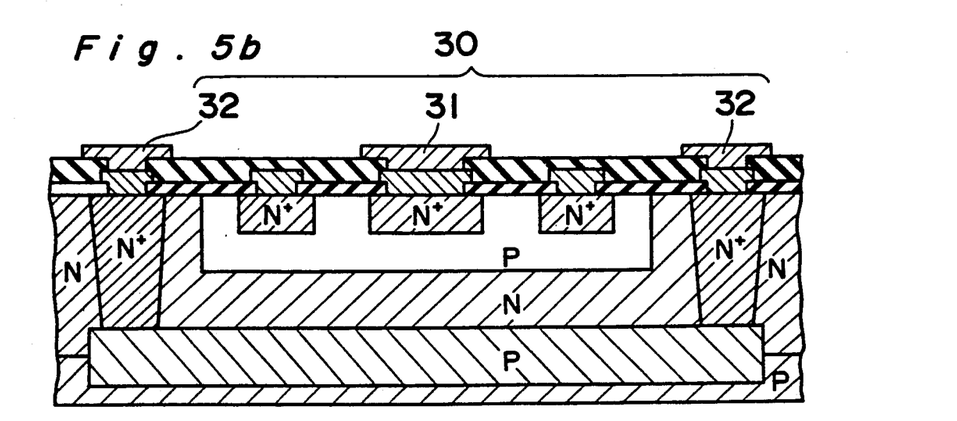
Figure 6:
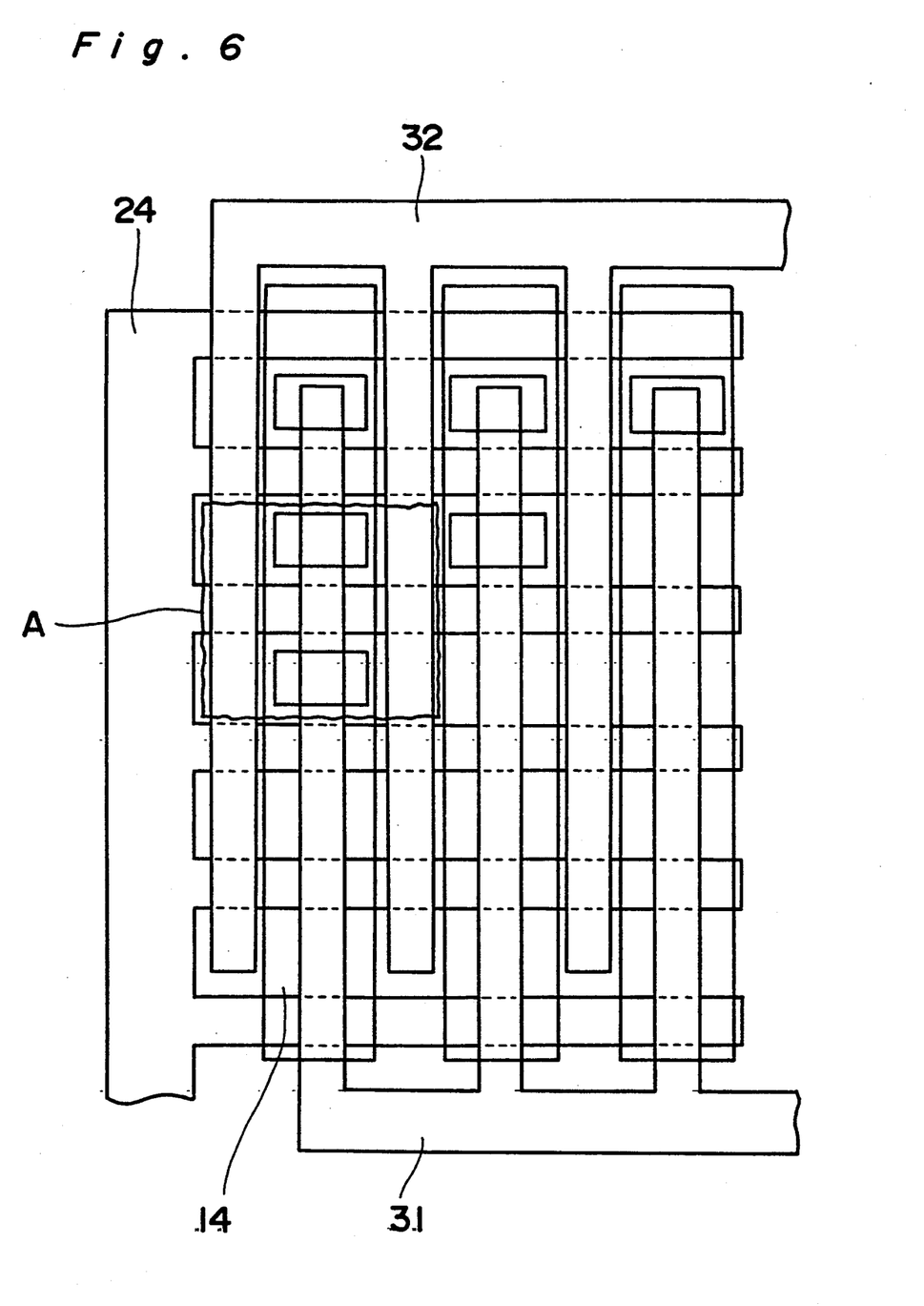
FIG. 6 is a diagrammatic view showing an arrangement of the power transistor device of the present invention.

Referring to FIGS. 5a and 5b, second electrode layer 30 defined by elongated electrode sections 31 and 32 is provided. Elongated electrode section 31 extends over openings 26a and in right angle relationship with the laterally extending electrode section 24 in the first electrode layer. Accordingly, by electrode section 31, median electrode segments 23 in the first electrode layer are electrically connected with each other. Electrode section 32 extends over openings 26b and in parallel to electrode section 31. Accordingly, by electrode section 32, electrode segments 21 in the first electrode layer are electrically connected with each other.

As shown in FIG. 6, elongated electrode sections 31 eventually defines a comb shaped configuration to connect all the median electrode segments 23, and elongated electrode sections 32 also defines a comb shaped configuration to connect all the electrode segments 21. Electrode sections 31 and 32 are interlaced. Since the base electrode sections 24 extend perpendicularly with respect to emitter electrode sections 31 and collector electrode sections 32 with a predetermined spacing defined by the thickness of the second insulation layer 26, the step coverage of the emitter and collector electrode sections 31, 32 will not be deteriorated. Also, since the number of columns 14 intercepted by base electrode section 24 can be selected to a number which is smaller than the number of transistor pairs 101 provided in each column, i.e., the number of transistor pairs 101 intercepted by emitter or collector electrode section 31 or 32, the bias current assigned to each base electrode section can be changed widely. Thus, it is possible to provide a uniform base bias voltage to each of the transistor units, thereby enabling the stable operation.

Figure 7:
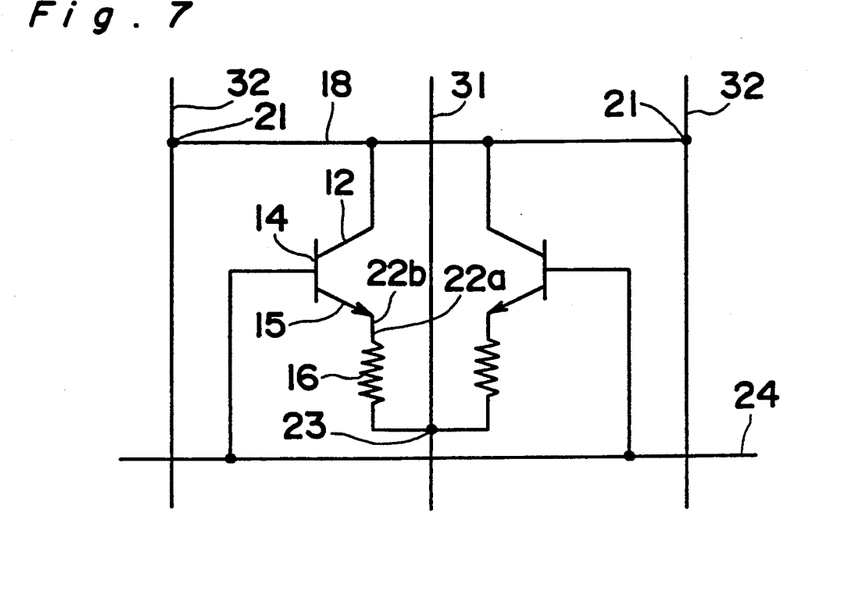
FIG. 7 is an equivalent circuit diagram of a pair of transistor units provided in the power transistor device.

Referring to FIG. 7, an equivalent circuit of a pair of transistor units formed by one resistor region 16 and two emitter regions 15 provided on the opposite sides, respectively, of the resistor region 16 is shown. The transistor pair is defined by two transistors connected in parallel to each other. The transistor pair is further connected in parallel with other transistor pairs such that comb shaped electrode 24 connects all the bases, comb shaped electrode 31 connects all the emitters, and comb shaped electrode 32 connects all the collectors, thereby providing a high power transistor device.

In the embodiment described above, resistor region 16 is long enough to provide a resistance which is equal to twice the resistance 16 (FIG. 7) connected to the emitter. Also, when emitter region 15 is arranged to have the same length as that of the resistor region 16 and positioned adjacent thereto with a necessary spacing for the insulation, the surface of the base region 14 can be utilized without producing any non-contributing spaces. Also, since the space between emitter region 15 and resistor region 16 is the least necessary spacing, regions 15 and 16 can be arranged to have a compact pattern.

Since emitter regions 15 are arranged in segments or in islands provided within the base region 14, a wide contact surface between the emitter region 15 and base region 14 can be obtained, thereby enabling a high power operation.

Since the resistance of the emitter stabilizing resistor connected to the emitter is determined by the distance between openings 19b and 19c in the insulation layer 19, the resistance can be produced with a high accuracy, even when a photomask (not shown) for making the insulation layer 19 deviates, as long as such openings 19b and 19c are formed over the resistor region 16. In this respect, it is preferable to provide resistor region 16 having a width greater than that of openings 19b and 19c. Accordingly, the resistors connected to the emitters of the transistor pair can be made equal to each other with a high accuracy, thereby ensuring a highly balanced collector currents through the transistor pair. Also, since the emitter stabilizing resistors connected to the emitters of the transistor pair are highly balanced, the resistance of such resistors can be selected to have a small value to increase the transistor efficiency, thereby improving the dynamic range of the transistor. The resistance can be made small by shortening the distance between openings 19b and 19c. This can be easily accomplished by rearranging the photomask (not shown) for forming the insulation layer 19. Alternately, the resistance also can be made small by providing a narrower resistor region 16.

Furthermore, since the negative feedback ability of the resistors formed by resistor region 16 can be maintained high due to less deviation of the resistance of the resistors, the ASO breakdown strength will not be reduced.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A power transistor device comprising:
   a collector region made of a first conductivity type and having an upper surface;
   a base region made of a second conductivity type and provided within said collector region and having an upper surface flush with said upper surface of said collector region;
   an elongated resistor region provided within said base region and having said first conductivity type and having an upper surface flush with said upper surface of said base region, said elongated resistor region forming first and second emitter stabilizing resistances which are aligned substantially linearly;
   a first elongated emitter region provided within said base region located on one side of said elongated resistor region and extending in a direction of elongation parallel to said elongated resistor region and having an upper surface flush with said upper surface of said base region:
   a second elongated emitter region provided within said base region located on an opposite side of said elongated resistor region and extending in a direction of elongation parallel to said elongated resistor region and having an upper surface flush with said upper surface of said base region;
   connecting means for electrically connecting said first and second elongated emitter regions respectively with opposite ends of said elongated resistor region; and
   emitter electrode means connected to said elongated resistor region at an area between said first and second emitter stabilizing resistances.

2. A power transistor as claimed in claim 1, wherein said elongated resistor region and elongated emitter regions have the same length and are aligned side-by-side.

3. A power transistor device as claimed in claim 1, wherein said base electrode strip is formed in the same plane as that formed with first, second and median electrodes.

4. A power transistor device as claimed in claim 1, further comprising an emitter electrode strip extending above said first and second electrodes and above and perpendicularly crossing said base electrode strip, and having a portion thereof connected to said median electrode.

5. A power transistor device as claimed in claim 1, further comprising a collector electrode strip extending above and perpendicularly crossing said base electrode strip, and having a portion thereof connected to said collector region.

6. A power transistor device as claimed in claim 1, wherein said connecting means are electrodes.

7. A power transistor device as claimed in claim 1, wherein said collector region, base region, elongated resistor region and first and second elongated emitter regions define a transistor pair, said transistor pair being aligned in two orthogonal directions with said emitter electrode means connected in common.

8. A power transistor device comprising:
   a collector region made of a first conductivity type and having an upper surface;

a base region made of a second conductivity type and provided within said collector region and having an upper surface flush with said upper surface of said collector region;

an elongated resistor region provided within said base region and having said first conductivity type and having an upper surface flush with said upper surface of said base region;

a first elongated emitter region provided within said base region located on one side of said elongated resistor region and extending in a direction of elongation parallel to said elongated resistor region, said first elongated emitter region having an upper surface flush with said upper surface of said base region;

a second elongated emitter region provided within said base region located on an opposite side of said elongated resistor region and extending in a direction of elongation parallel to said elongated resistor region, said second elongated emitter region having an upper surface flush with said upper surface of said base region;

an insulation layer extending over said collector region, base region, elongated resistor region and first and second elongated emitter regions, said insulation layer having emitter contact holes formed over said first and second elongated emitter regions, first resistor contact holes formed over opposite end areas of said elongated resistor region, and a second resistor contact hole formed over said elongated resistor region and spaced away from and between said first resistor contact holes, said first and second resistor contact holes being narrower in width than that of said elongated resistor region, said elongated resistor region being located to extend between said first and said second resistor contact holes, said elongated resistor region forming first and second emitter stabilizing resistances which are aligned substantially linearly;

electrode means for electrically connecting said first and second emitter regions through said emitter contact holes, respectively, with opposite ends of said elongated resistor regions through said first resistor contact holes; and emitter electrode means connected to said elongated resistor region through said second resistor contact hole.

9. A power transistor as claimed in claim 8, wherein said collector region, base region, elongated resistor region and first and second elongated emitter regions define a transistor pair, said transistor pair being aligned in two orthogonal directions with said emitter electrode means connected in common.

* * * * *